United States Patent
Zhao et al.

(10) Patent No.: US 12,550,621 B2
(45) Date of Patent: Feb. 10, 2026

(54) TOP CONTACT STRUCTURE FOR EMBEDDED MRAM

(71) Applicant: INTERNATIONAL BUSINESS MACHINES CORPORATION, Armonk, NY (US)

(72) Inventors: Ailian Zhao, Slingerlands, NY (US); Wu-Chang Tsai, Albany, NY (US); Ashim Dutta, Clifton Park, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 605 days.

(21) Appl. No.: 18/046,162

(22) Filed: Oct. 13, 2022

(65) Prior Publication Data

US 2024/0130242 A1   Apr. 18, 2024

(51) Int. Cl.
| | |
|---|---|
| *H10N 50/10* | (2023.01) |
| *H01L 23/48* | (2006.01) |
| *H10B 61/00* | (2023.01) |
| *H10N 50/01* | (2023.01) |
| *H10N 50/80* | (2023.01) |

(52) U.S. Cl.
CPC .......... *H10N 50/10* (2023.02); *H01L 23/481* (2013.01); *H10B 61/00* (2023.02); *H10N 50/01* (2023.02); *H10N 50/80* (2023.02)

(58) Field of Classification Search
CPC ....... H10N 50/10; H10N 50/80; H01L 23/481
See application file for complete search history.

(56) References Cited

U.S. PATENT DOCUMENTS

| | | | |
|---|---|---|---|
| 9,343,659 B1 | 5/2016 | Lu | |
| 9,793,156 B1 | 10/2017 | Yang | |
| 9,818,690 B2 | 11/2017 | Tsai | |
| 10,741,751 B2 | 8/2020 | Lanzillo | |
| 10,985,312 B2 | 4/2021 | Liao | |
| 11,069,613 B2 | 7/2021 | Lee | |
| 11,094,788 B2 | 8/2021 | Yu | |
| 2013/0119494 A1 | 5/2013 | Li | |
| 2016/0365505 A1 | 12/2016 | Lu | |
| 2020/0395535 A1* | 12/2020 | Liao | H01F 41/34 |
| 2021/0005548 A1* | 1/2021 | Lee | H01L 23/5226 |
| 2022/0165936 A1* | 5/2022 | Shen | H10N 50/01 |
| 2022/0310903 A1* | 9/2022 | Huang | H10N 50/80 |

FOREIGN PATENT DOCUMENTS

CN    109994600 A    7/2019

* cited by examiner

*Primary Examiner* — Shih Tsun A Chou
(74) *Attorney, Agent, or Firm* — Yuanmin Cai

(57) ABSTRACT

Embodiments of present invention provide a method of forming a MRAM structure. The method includes forming at least one magnetic tunnel junction (MTJ) stack on top of a supporting structure; forming a conformal liner surrounding a sidewall of the MTJ stack; forming a first dielectric layer surrounding the conformal liner; selectively forming a metal oxide layer on top of the conformal liner and the first dielectric layer, the metal oxide layer having at least a first opening that exposes a top surface of the MTJ stack; and forming a top contact contacting the top surface of the MTJ stack through the first opening in the metal oxide layer. An MRAM structure formed thereby is also provided.

18 Claims, 13 Drawing Sheets

TOP CONTACT STRUCTURE FOR EMBEDDED MRAM

BACKGROUND

The present application relates to manufacturing of semiconductor integrated circuits. More particularly, it relates to method of forming a top contact to a magnetoresistive random-access memory and the structure formed thereby.

With the explosion of digital information, semiconductor memory devices are playing an ever increasingly important role in the managing and organizing of this digital information through, for example, storing, retrieving, and/or transformation of this digital information. Magnetoresistive random-access memory (MRAM) is a type of non-volatile memory (NVM) capable of holding saved data even in the event that power to the memory is down or is accidentally cut off. There have been several recent developments in the technology that allow MRAM to be used successfully in specific emerging applications, as well as in not-so-new ones.

MRAM technology is based on a component known as magnetic tunnel junction (MTJ) that generally includes two ferromagnetic layers separated by an insulating layer knows as a tunnel barrier layer. In a vertical MRAM device, a top and a bottom electrode compliment the MTJ to form a vertical MTJ stack. For high performance MRAM devices that are based on vertical MTJ stacks, well-defined interfaces are essential for reliability and performance of the devices. However, current manufacturing process, and in particular the process in forming the top contact contacting the top electrode of a MTJ stack, may lead to short between the two ferromagnetic layers and/or the top and bottom electrodes of a MTJ stack that are otherwise insulated from each other by the insulating layer.

One current approach is to form the top electrode of the MTJ stack tall enough so as to prevent the top contact that is formed on top of the top electrode from reaching sidewalls of the MTJ stack at or below the tunnel barrier layer. This approach results in the increase in the total height of the MTJ stack thereby creating challenges to capabilities of tools currently in use with shadowing effects for ion-beam-etching (IBE), as well as high aspect ratio for reactive-ion-etching (RIE) of vias. Moreover, this places overall limits on the fitting of MTJ stacks or the MRAM structure based on that into narrow intermetal dielectric spacing in, particularly, advanced node technologies.

SUMMARY

Embodiments of present invention provide a MRAM device. The MRAM device includes a MRAM structure. The MRAM structure includes a magnetic tunnel junction (MTJ) stack; and a top contact, the top contact having a first portion directly above the MTJ stack and a second portion above the first portion, wherein the first portion of the top contact is horizontally surrounded by a metal oxide layer, and a portion of the second portion is directly above the metal oxide layer.

According to one embodiment, the MRAM device further includes a via contact in contact with a conductive via, wherein the via contact has a first portion and a second portion, the first portion of the via contact is directly above the conductive via and has a substantially same size as that of the conductive via at an interface with the conductive via, and the second portion of the via contact is above the first portion of the via contact and is partially above the metal oxide layer.

In one embodiment, a top surface of the MTJ stack is substantially coplanar with a top surface of the conductive via.

In another embodiment, the first portion of the top contact is vertically aligned with a top surface of the MTJ stack.

In yet another embodiment, the MTJ stack is surrounded by a conformal dielectric layer at a sidewall thereof, and the conformal dielectric layer is vertically covered by the metal oxide layer.

In one embodiment, the metal oxide layer includes either aluminum-oxide (AlOx) or hafnium-oxide (HfOx).

In another embodiment, the MTJ stack includes a bottom electrode, the bottom electrode being on top of a conductive pedestal and the conductive pedestal being formed on top of a metal layer of a back-end-of-line (BEOL) structure.

Embodiments of present invention provide a method of making a semiconductor structure. The method includes forming at least one magnetic tunnel junction (MTJ) stack on top of a supporting structure; forming a conformal liner surrounding a sidewall of the MTJ stack; forming a first dielectric layer surrounding the conformal liner; selectively forming a metal oxide layer on top of the conformal liner and the first dielectric layer, the metal oxide layer having at least a first opening that exposes a top surface of the MTJ stack; and forming a top contact contacting the top surface of the MTJ stack through the first opening in the metal oxide layer.

In one embodiment, selectively forming the metal oxide layer includes selectively forming a self-assembled monolayer (SAM) coating on top of the top surface of the MTJ stack; forming the metal oxide layer on top of the conformal liner and the first dielectric layer while the top surface of the MTJ stack is covered by the SAM coating; and removing the SAM coating to expose the top surface of the MTJ stack.

According to one embodiment, the method further includes, after forming the conformal liner and the first dielectric layer, forming a conductive via through the first dielectric layer and the conformal liner, the conductive via being in contact with a metal layer embedded in the supporting structure.

According to another embodiment, the method further includes depositing a second dielectric layer on top of the metal oxide layer; and creating at least one trench opening in the second dielectric layer, wherein the at least one trench opening overlaps with the first opening in the metal oxide layer to expose the top surface of the MTJ stack.

In one embodiment, forming the at least one trench opening includes etching the second dielectric layer through a selective etching process that stops at the metal oxide layer and at the top surface of the MTJ stack.

In another embodiment, a lower portion of the top contact is surrounded by the metal oxide layer.

BRIEF DESCRIPTION OF THE DRAWINGS

The present invention will be understood and appreciated more fully from the following detailed description of embodiments of present invention, taken in conjunction with accompanying drawings of which.

Figure 1:
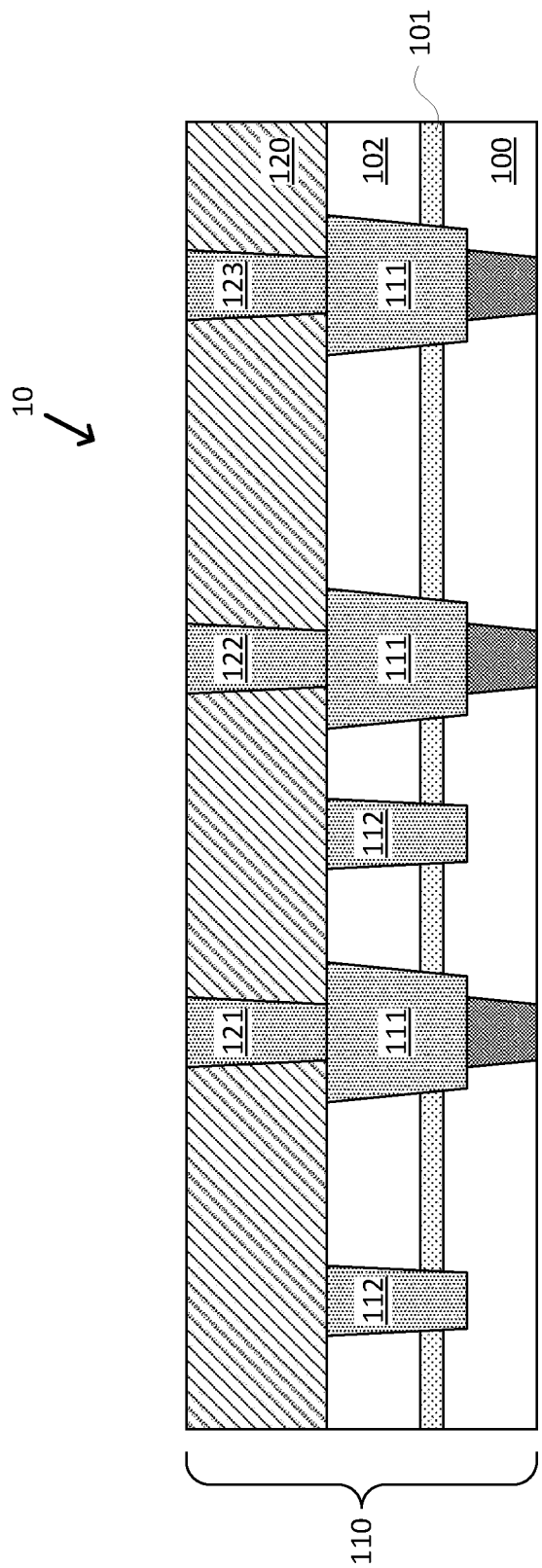
FIG. 1 is a demonstrative illustration of cross-sectional view of a MRAM device in a step of manufacturing thereof according to one embodiment of present invention.

It will be appreciated that for simplicity and clarity purpose, elements shown in the drawings have not necessarily been drawn to scale. Further, and if applicable, in various functional block diagrams, two connected devices and/or elements may not necessarily be illustrated as being connected. In some other instances, grouping of certain elements in a functional block diagram may be solely for the purpose of description and may not necessarily imply that they are in a single physical entity, or they are embodied in a single physical entity.

DETAILED DESCRIPTION

In the below detailed description and the accompanying drawings, it is to be understood that various layers, structures, and regions shown in the drawings are both demonstrative and schematic illustrations thereof that are not drawn to scale. In addition, for the ease of explanation, one or more layers, structures, and regions of a type commonly used to form semiconductor devices or structures may not be explicitly shown in a given illustration or drawing. This does not imply that any layers, structures, and regions not explicitly shown are omitted from the actual semiconductor structures. Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error may be present such as, by way of example only, 1% or less than the stated amount. Likewise, the terms "on", "over", or "on top of" that are used herein to describe a positional relationship between two layers or structures are intended to be broadly construed and should not be interpreted as precluding the presence of one or more intervening layers or structures.

To provide spatial context to different structural orientations of the semiconductor structures shown in the drawings, XYZ Cartesian coordinates may be provided in some of the drawings. The terms "vertical" or "vertical direction" or "vertical height" as used herein denote a Z-direction of the Cartesian coordinates shown in the drawings, and the terms "horizontal" or "horizontal direction" or "lateral direction" as used herein denote an X-direction and/or a Y-direction of the Cartesian coordinates shown in the drawings.

Moreover, although various reference numerals may be used across different drawings, the same or similar reference numbers are used throughout the drawings to denote the same or similar features, elements, or structures, and thus detailed explanations of the same or similar features, elements, or structures may not be repeated for each of the drawings for economy of description. Labelling for the same or similar elements in some drawings may be omitted as well in order not to overcrowd the drawings.

FIG. 1 is a demonstrative illustration of cross-sectional view of a MRAM device in a step of manufacturing thereof according to one embodiment of present invention. More particularly, in forming a semiconductor structure such as a MRAM device 10 (see FIG. 12 for more details), embodiments of present invention provide receiving a supporting structure 110 such as, for example, a back-end-of-line (BEOL) structure. The supporting structure 110 may include, for example, a stack of one or more interlevel-dielectric (ILD) layers including a first ILD layer 100 and a second ILD layer 102 on top of the first ILD layer 100 through a capping layer 101. For example, in one embodiment, the first ILD layer 100 may be an oxide layer, the second ILD layer 102 may be an ultra-low k dielectric layer, and the capping layer may be a NBlok layer. The supporting structure 110 may further include one or more metal layers such as, for example, metal layers 111 and 112 embedded therein. For example, metal layers 111 and 112 may be M2 or M3 layers in the BEOL structure. Metal layers 111 and 112 may be made of copper (Cu), cobalt (Co), ruthenium (Ru), tungsten (W), or other suitable conductive materials and may serve as bottom contacts to the MRAM device 10.

The supporting structure 110 may also include a dielectric layer 120 on top of the metal layers 111 and 112 and the second ILD layer 102 and may have one or more conductive pedestals 121, 122, and 123 embedded in the dielectric layer 120. The dielectric layer 120 may be a layer of silicon-nitride (SiN), silicon-carbonitride (SiCN), tetraethyl orthosilicate (TEOS), or other suitable dielectric materials. The one or more conductive pedestals 121, 122, and 123 may be made of Cu, Co, Ru, or W, and in one embodiment may include the same material as that of the metal layer 111. The one or more conductive pedestals 121, 122, and 123 may extend to the metal layer 111, thereby connecting bottom electrodes of the MTJ structure of MRAM device 10, to be formed thereupon as being described below in more details, to the metal layer 111.

Figure 2:
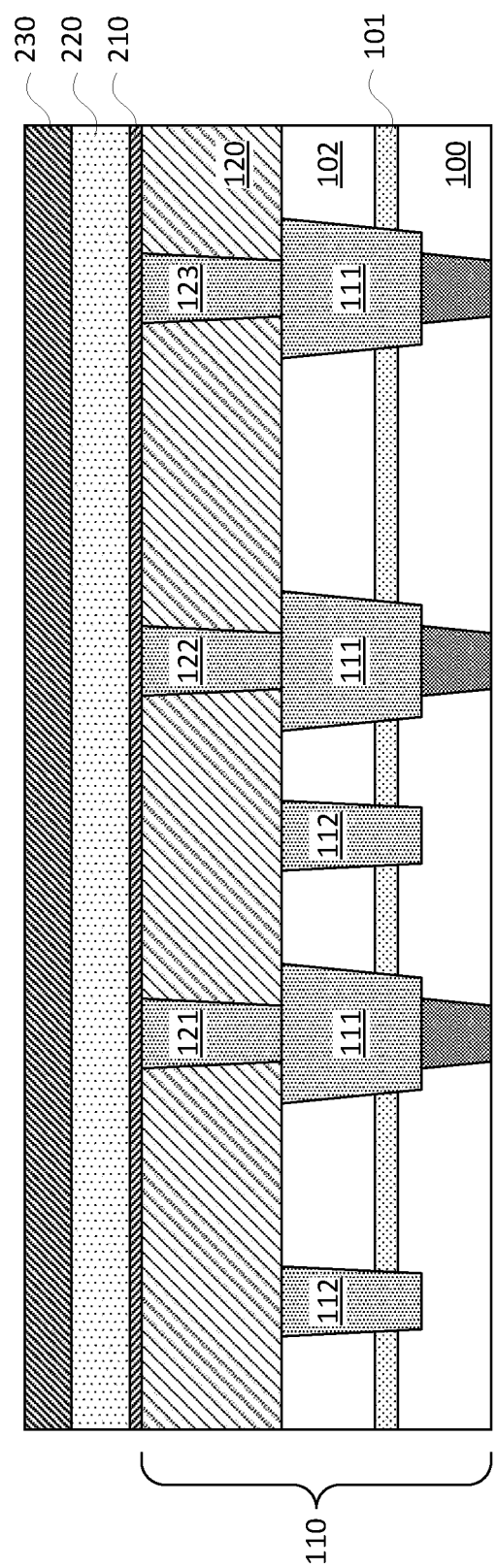
FIG. 2 is a demonstrative illustration of cross-sectional view of a MRAM device in a step of manufacturing thereof, following the step illustrated in FIG. 1, according to one embodiment of present invention.

FIG. 2 is a demonstrative illustration of cross-sectional view of a MRAM device in a step of manufacturing thereof, following the step illustrated in FIG. 1, according to one embodiment of present invention. More particularly, embodiments of present invention provide forming, such as through deposition, a bottom electrode layer 210 on top of the dielectric layer 120 and the conductive pedestals 121, 122, and 123, forming a MTJ layer 220 on top of the bottom electrode layer 210, and forming a top electrode layer 230 on top of the MTJ layer 220. The bottom electrode layer 210 may be a layer of tantalum-nitride (TaN), titanium-nitride (TiN), a combination of TaN and TiN, or other conductive materials suitable for forming electrode, and may generally have a thickness ranging around a few to tens nanometers.

The MTJ layer 220 may generally include a stack of layers including a reference layer, a free layer, and a tunnel barrier layer in-between the reference layer and the free layer. The reference layer and/or the free layer may include ferromagnetic materials. For example, the reference layer and/or the free layer may be layers of cobalt (Co), iron (Fe), and boron (B) based material (CoFeB) such as, for example, an alloy of Co, Fe, and B. However, embodiments of present invention are not limited in this aspect and the reference layer and/or the free layer may be layers of other suitable materials such as, for example, an alloy of Co and Fe (CoFe) or an alloy of nickel and Fe (NiFe). The reference layer and/or the free layer may generally have a thickness ranging around tens nanometers. On the other hand, the tunnel barrier layer may be a layer of magnesium oxide (MgO) or other suitable materials such as, for example, $Al_2O_3$ and $TiO_2$. The tunnel barrier layer may generally have a thickness ranging around a few nanometers.

The top electrode layer 230 may be a layer of conductive material including, for example, niobium (Nb), niobium-nitride (NbN), Ta, TaN, Ti, TiN, W, tungsten-nitride (WN), and other metals with high melting point or other conductive metal nitrides. The top electrode layer 230 may generally have a thickness ranging around tens nanometers.

Figure 3:
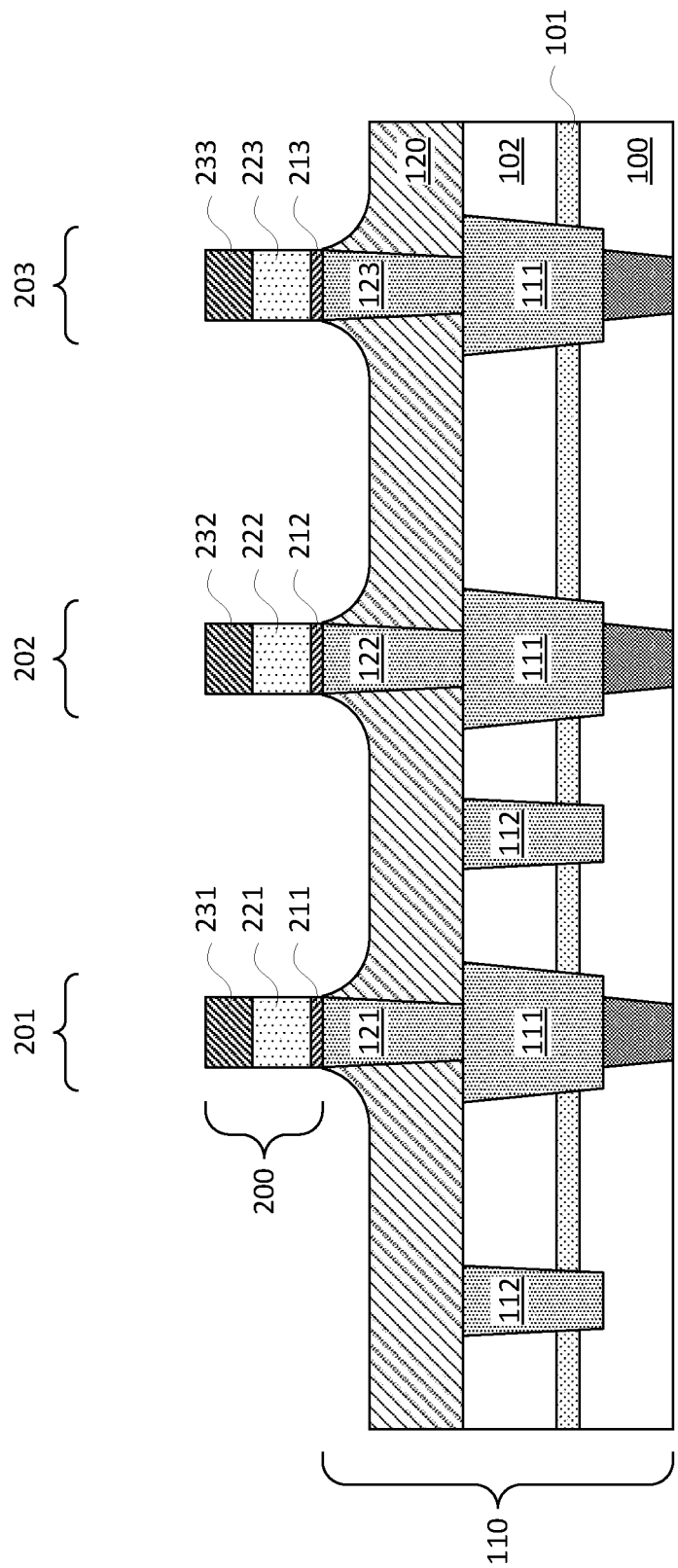
FIG. 3 is a demonstrative illustration of cross-sectional view of a MRAM device in a step of manufacturing thereof, following the step illustrated in FIG. 2, according to one embodiment of present invention.

FIG. 3 is a demonstrative illustration of cross-sectional view of a MRAM device in a step of manufacturing thereof, following the step illustrated in FIG. 2, according to one embodiment of present invention. More particularly, embodiments of present invention provide patterning the top electrode layer 230, the MTJ layer 220, and the bottom electrode layer 210 into one or more MTJ stacks such as, for example, MTJ stacks 201, 202, and 203. For example, the MTJ stack 201 may include a stack 200 of layers that includes a top electrode 231, a MTJ 221, and a bottom electrode 211. Similarly, the MTJ stack 202 may include a top electrode 232, a MTJ 222, and a bottom electrode 212, and the MTJ stack 203 may include a top electrode 233, a MTJ 223, and a bottom electrode 213. The patterning may be made through a lithographic patterning process followed by an etching process. The etching process may be an anisotropic etching process such as, for example, a reactive-ion-etching (RIE) process, an ion-beam-etching (IBE) process, or other directional etching process. In one embodiment, the etching process may partially etch into the dielectric layer 120 as is illustrated in FIG. 3 due to, for example, gauging or other etching effect.

Figure 4:
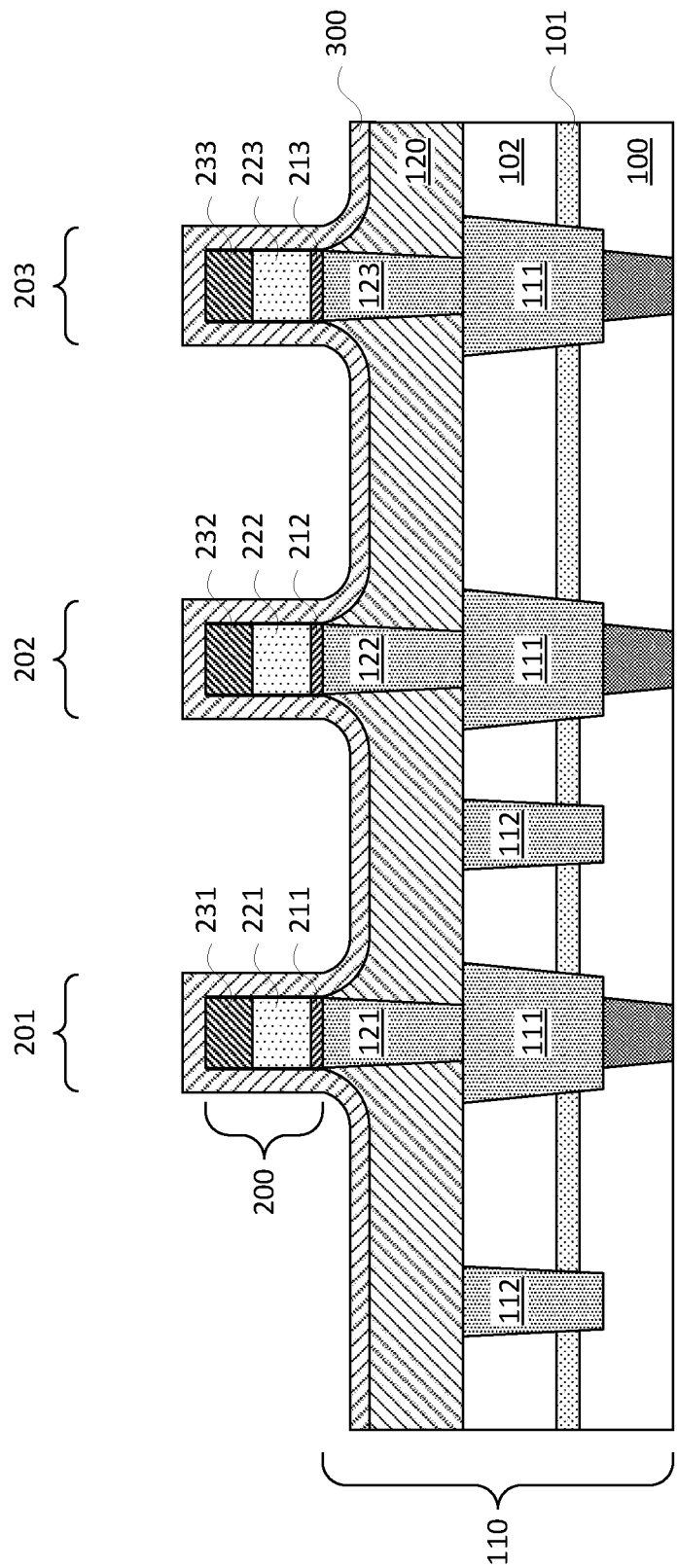
FIG. 4 is a demonstrative illustration of cross-sectional view of a MRAM device in a step of manufacturing thereof, following the step illustrated in FIG. 3, according to one embodiment of present invention.

FIG. 4 is a demonstrative illustration of cross-sectional view of a MRAM device in a step of manufacturing thereof, following the step illustrated in FIG. 3, according to one embodiment of present invention. More particularly, embodiments of present invention provide forming a conformal liner layer 300 covering the one or more MTJ stacks 201, 202, and 203, although the liner layer may not necessarily be conformal and other non-conformal liner layers may be used as well. The conformal liner layer 300 may cover sidewalls of the MTJ stacks 201, 202, and 203 above the conductive pedestals 121, 122, and 123 respectively. The conformal liner layer 300 may also cover top surfaces of the top electrodes 231, 232, and 233 and cover the top surface of the second ILD layer 102 that surround the conductive pedestals 121, 122, and 123. The conformal liner layer 300 may include dielectric materials such as, for example, SiN and SiCN and may be formed through a chemical-vapor-deposition (CVD) process, a physical-vapor-deposition (PVD) process, or an atomic-layer-deposition (ALD) process.

Figure 5:
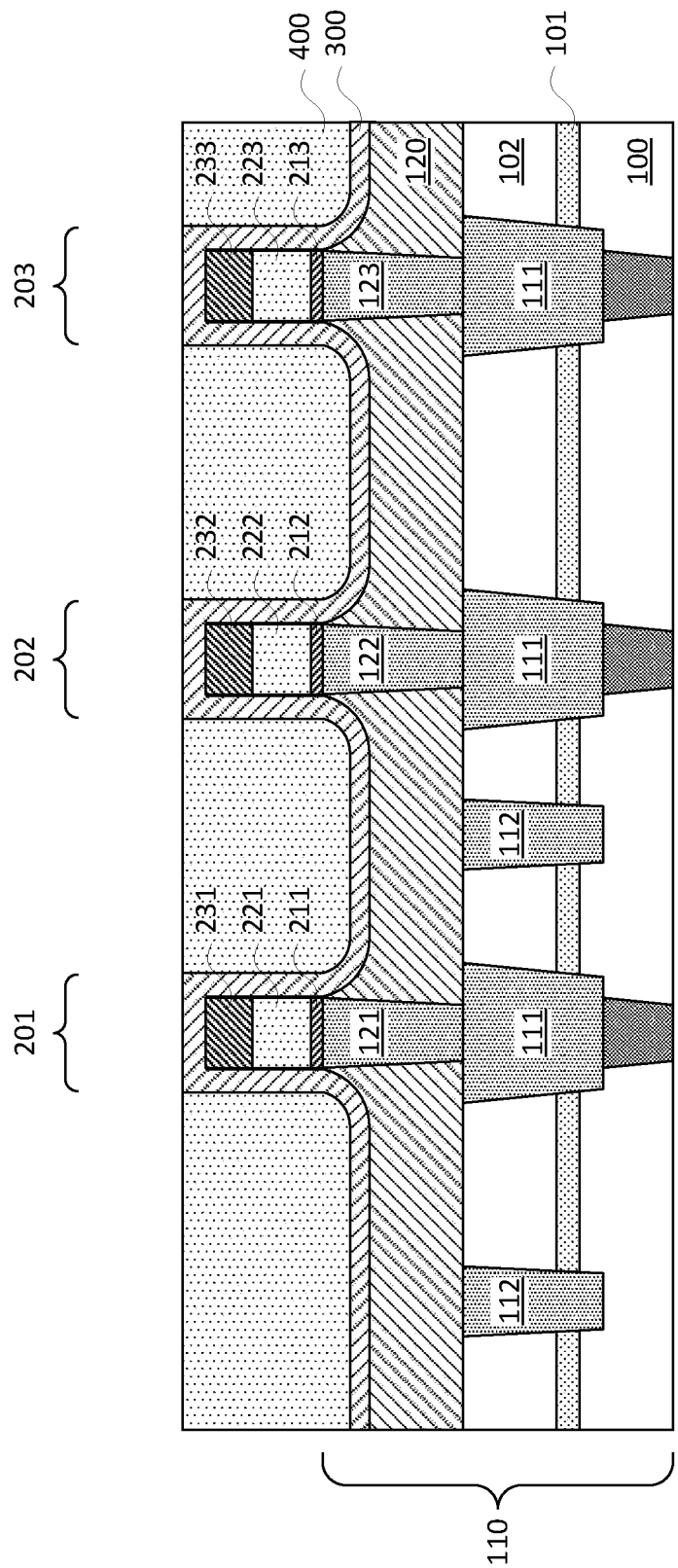
FIG. 5 is a demonstrative illustration of cross-sectional view of a MRAM device in a step of manufacturing thereof, following the step illustrated in FIG. 4, according to one embodiment of present invention.

FIG. 5 is a demonstrative illustration of cross-sectional view of a MRAM device in a step of manufacturing thereof, following the step illustrated in FIG. 4, according to one embodiment of present invention. More particularly, embodiments of present invention provide forming a blanket first dielectric layer 400 surrounding the conformal liner layer 300. In one embodiment, the blanket first dielectric layer 400 may be, for example, an ultra-low k dielectric material and may be formed or deposited through a CVD, PVD, or ALD process. After the deposition, a chemical-mechanic-polishing (CMP) process may be applied to planarize the top surface of the blanket first dielectric layer 400 by removing excessive ultra-low k dielectric material above the top of the conformal liner layer 300. For example, after the CMP process, the top surface of the blanket first dielectric layer 400 may become coplanar with portions of the conformal liner layer 300 that are on top of the top electrode 231, 232, and 233.

Figure 6:
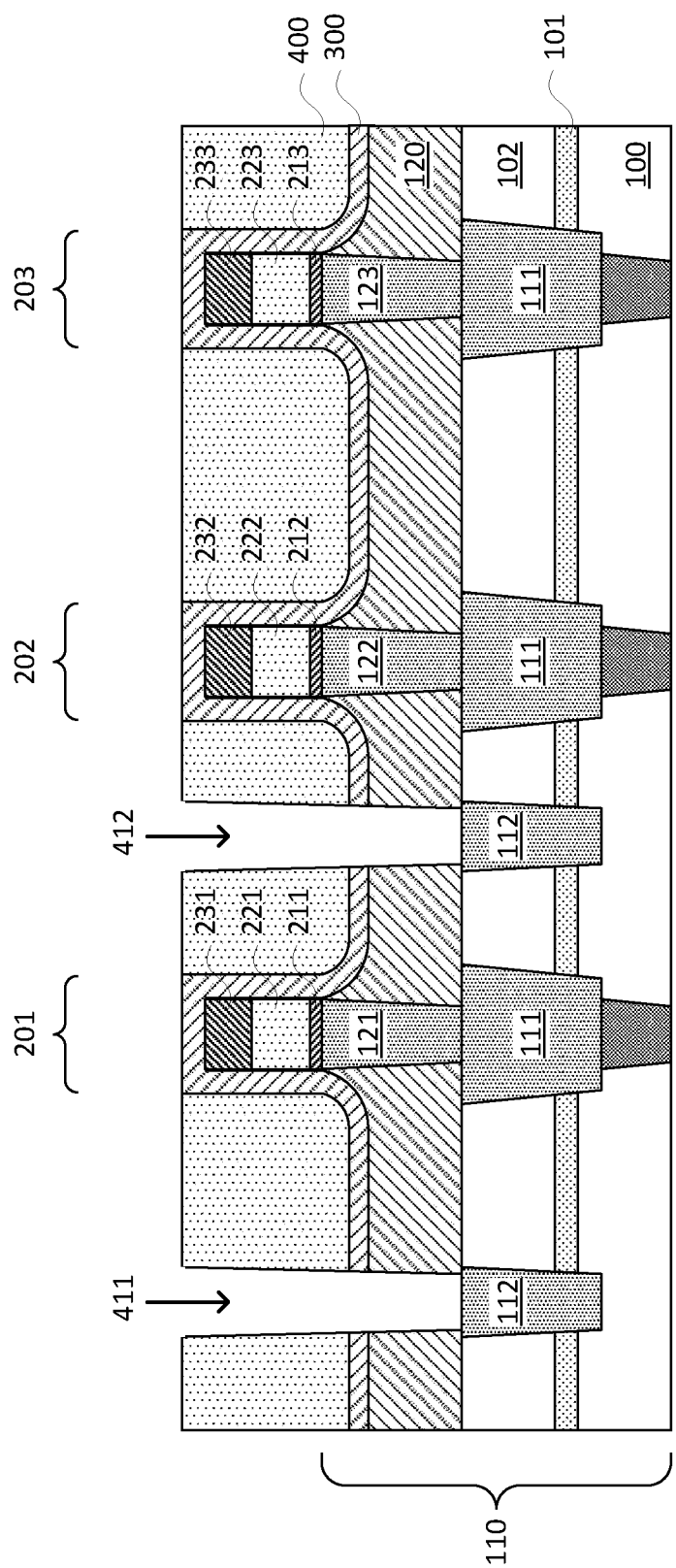
FIG. 6 is a demonstrative illustration of cross-sectional view of a MRAM device in a step of manufacturing thereof, following the step illustrated in FIG. 5, according to one embodiment of present invention.

FIG. 6 is a demonstrative illustration of cross-sectional view of a MRAM device in a step of manufacturing thereof, following the step illustrated in FIG. 5, according to one embodiment of present invention. More particularly, embodiments of present invention provide creating via openings such as, for example, via openings 411 and 412 in the blanket first dielectric layer 400. The via openings 411 and 412 may be made through a lithographic patterning and etching process and may be made sufficiently deep into the blanket first dielectric layer 400, through the conformal liner layer 300, and through the dielectric layer 120. The via openings 411 and 412 may expose the metal layer 112 embedded in the supporting structure 110.

Figure 7:
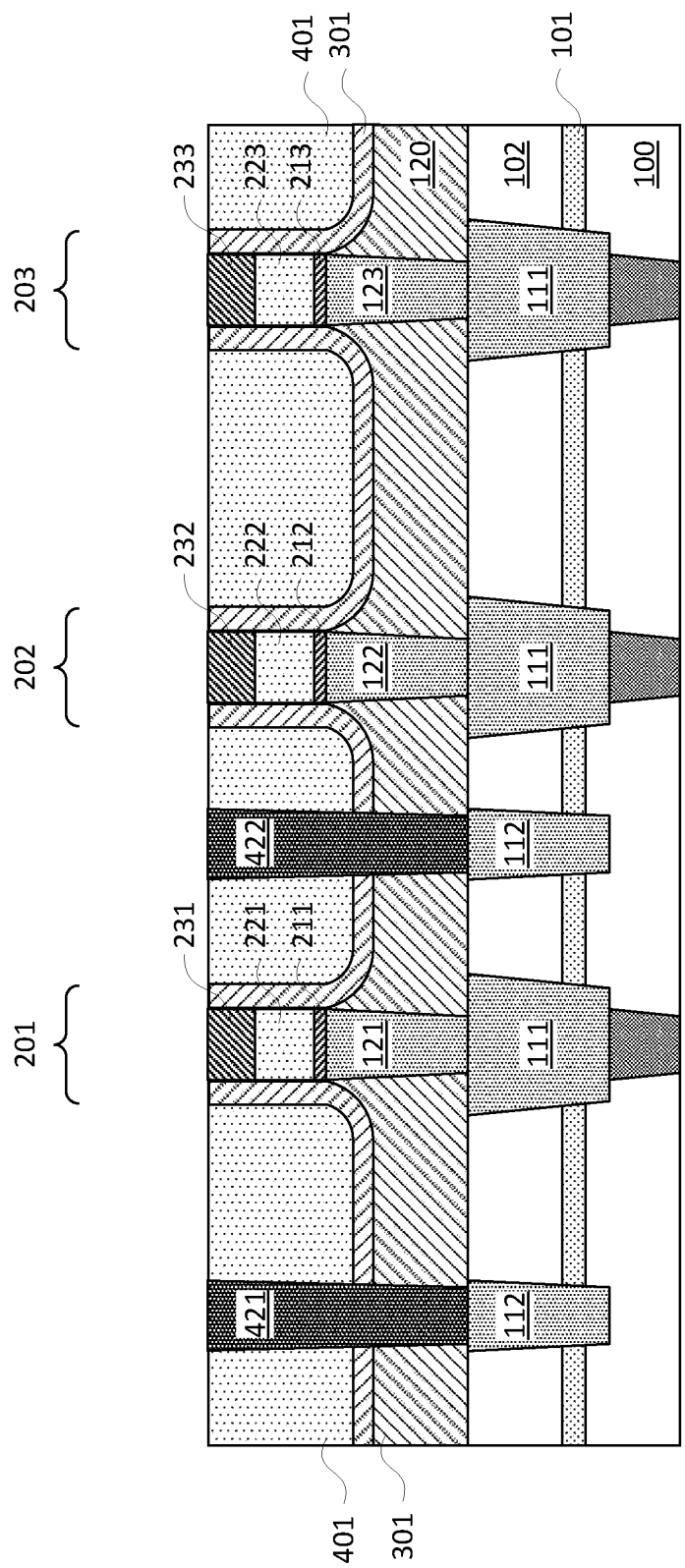
FIG. 7 is a demonstrative illustration of cross-sectional view of a MRAM device in a step of manufacturing thereof, following the step illustrated in FIG. 6, according to one embodiment of present invention.

FIG. 7 is a demonstrative illustration of cross-sectional view of a MRAM device in a step of manufacturing thereof, following the step illustrated in FIG. 6, according to one embodiment of present invention. More particularly, embodiments of present invention provide depositing a conductive material such as, for example, Cu, Co, Ru, W, and other suitable materials into the via openings 411 and 412 to form conductive vias 421 and 422. The deposition of conductive material into the via openings 411 and 412 may be followed by a CMP process. The CMP process may remove any excessive conductive material that are on top of the first dielectric layer 401 as a result of the deposition process. Moreover, in addition to removing the excessive conductive material, the CMP process may subsequently remove portions of the conformal liner layer 300 that are on top of the top electrodes 231, 232, and 233, and a portion of the blanket first dielectric layer 400, thereby resulting in a first dielectric layer 401 and a conformal liner 301 surrounding the sidewalls of the MTJ stacks 201, 202, and 203. In other words, embodiments of present invention provide exposing top surfaces of the top electrodes 231, 232, and 233 through the CMP process. As a result, top surfaces of the top electrodes 231, 232, and 233, which are also top surfaces of the MTJ stacks 201, 202, and 203, become substantially coplanar with top surfaces of the conductive vias 421 and 422.

Figure 8:
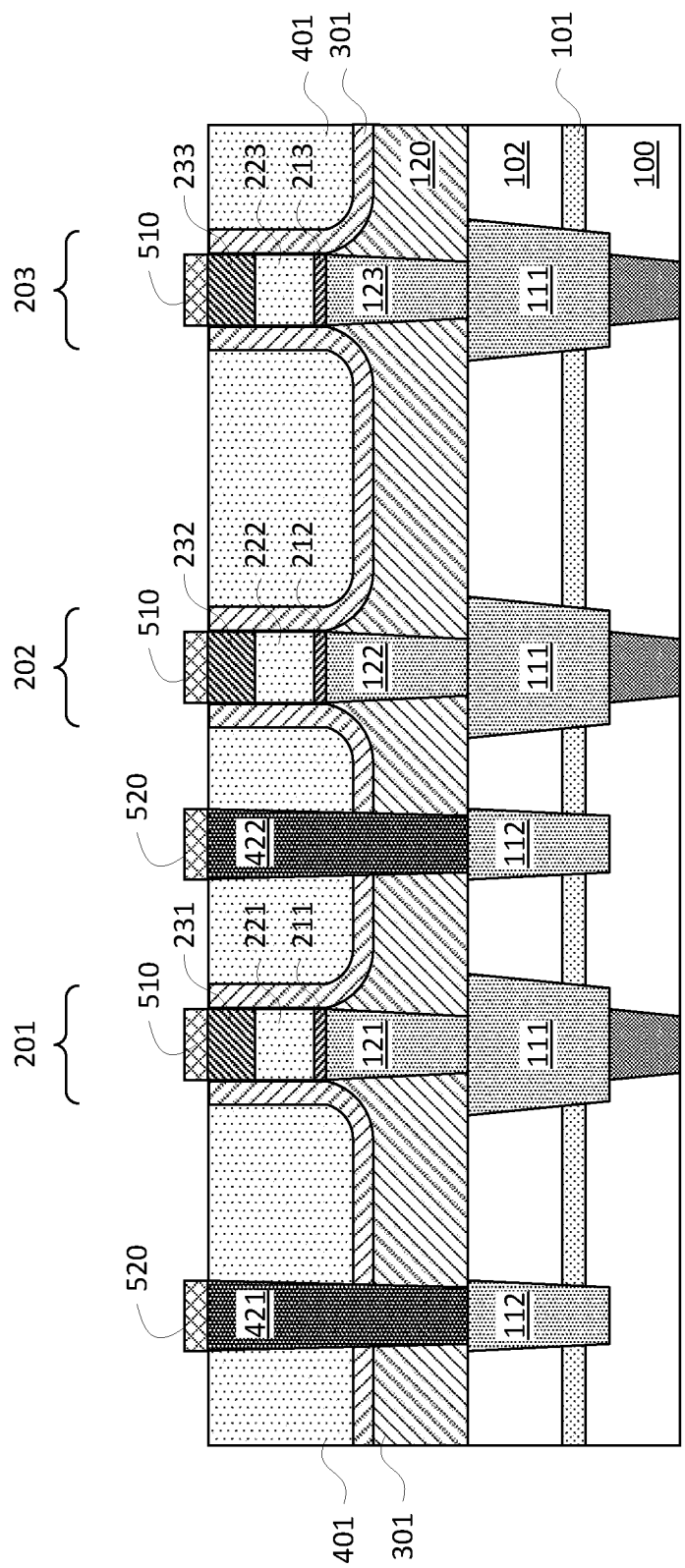
FIG. 8 is a demonstrative illustration of cross-sectional view of a MRAM device in a step of manufacturing thereof, following the step illustrated in FIG. 7, according to one embodiment of present invention.

FIG. 8 is a demonstrative illustration of cross-sectional view of a MRAM device in a step of manufacturing thereof, following the step illustrated in FIG. 7, according to one embodiment of present invention. More particularly, embodiments of present invention provide selectively forming a layer of self-assembled monolayer (SAM) coating on top of the MRAM device 10. For example, the SAM coating may be a layer of self-assembled monolayer of polymer. According to embodiment of present invention, the SAM coating may only form on top of conductive materials and will hardly form on top of other materials such as dielectric materials. As a result, the SAM coating may be formed only on top of the top electrodes 231, 232, and 232 and the conductive vias 421 and 422, and may not form on top of the first dielectric layer 401 and the exposed top surfaces of the conformal liner 301. Here, the exposed top surfaces of the conformal liner 301 refer to the cross-sectional area surfaces of the conformal liner 301 that are coplanar with the top surface of the first dielectric layer 401.

In other words, embodiments of present invention cause the SAM coating to form cap layers 510 on top of the MTJ stacks 201, 202, and 203 and to form cap layers 520 on top of the conductive vias 421 and 422, while at the same time cause the first dielectric layer 401 and the top surfaces of the conformal liner 301 to remain substantially exposed. As a result, the cap layers 510 may have substantially same sizes and shapes as that of the top surface of the top electrodes 231, 232, and 233. Similarly, the cap layers 520 may have substantially same sizes and shapes as that of the conductive vias 421 and 422 at their interfaces.

Figure 9:
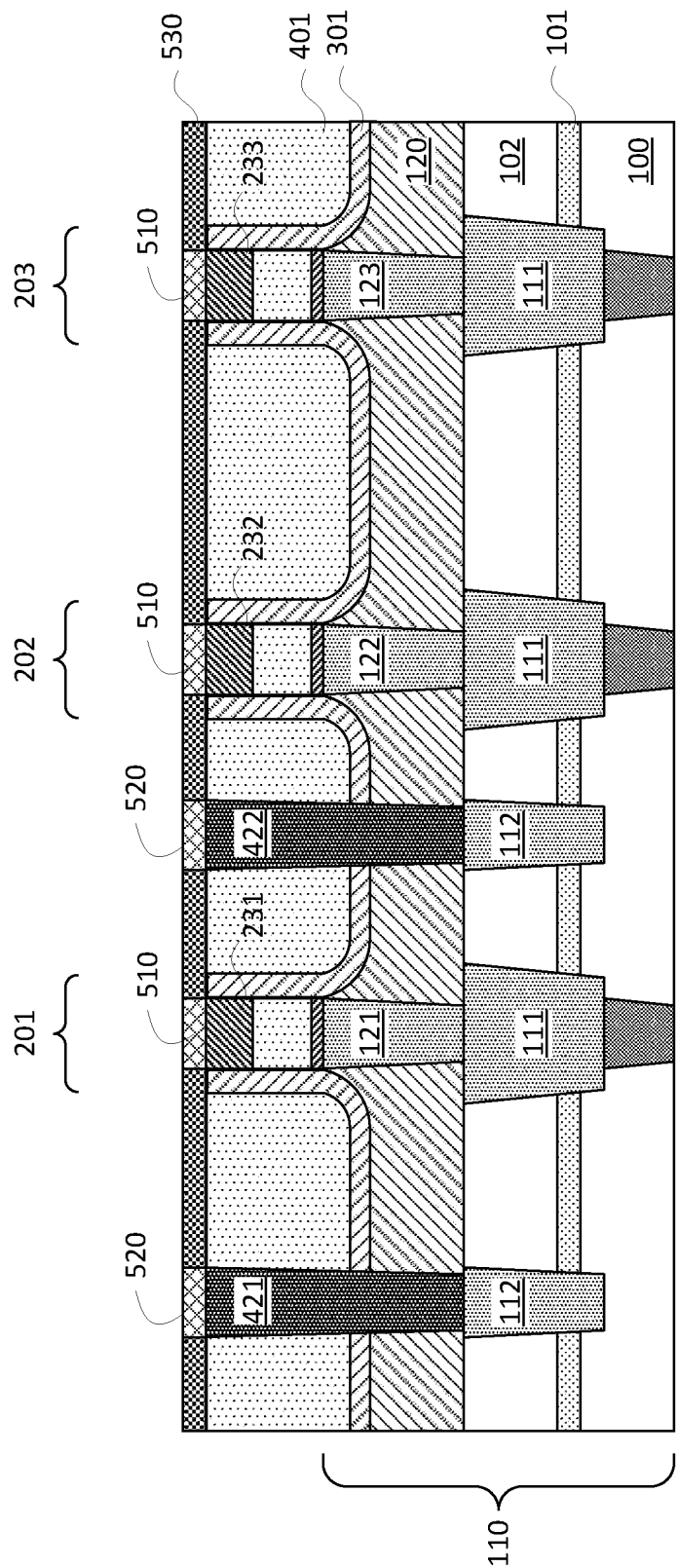
FIG. 9 is a demonstrative illustration of cross-sectional view of a MRAM device in a step of manufacturing thereof, following the step illustrated in FIG. 8, according to one embodiment of present invention.

FIG. 9 is a demonstrative illustration of cross-sectional view of a MRAM device in a step of manufacturing thereof, following the step illustrated in FIG. 8, according to one embodiment of present invention. More particularly, embodiments of present invention provide selectively forming a metal oxide layer 530 on top of the first dielectric layer 401 and the exposed top surfaces of the conformal liner 301. The forming of the metal oxide layer 530 may be made through a deposition process, such as an ALD, CVD or PVD process, and the deposition process may leave the SAM coating such as the cap layers 510 and 520 substantially uncovered. The metal oxide layer 530 may be formed from, for example, aluminum-oxide (AlOx) or hafnium-oxide (HfOx) and may be formed to have a thickness ranging around tens nanometers.

Figure 10:
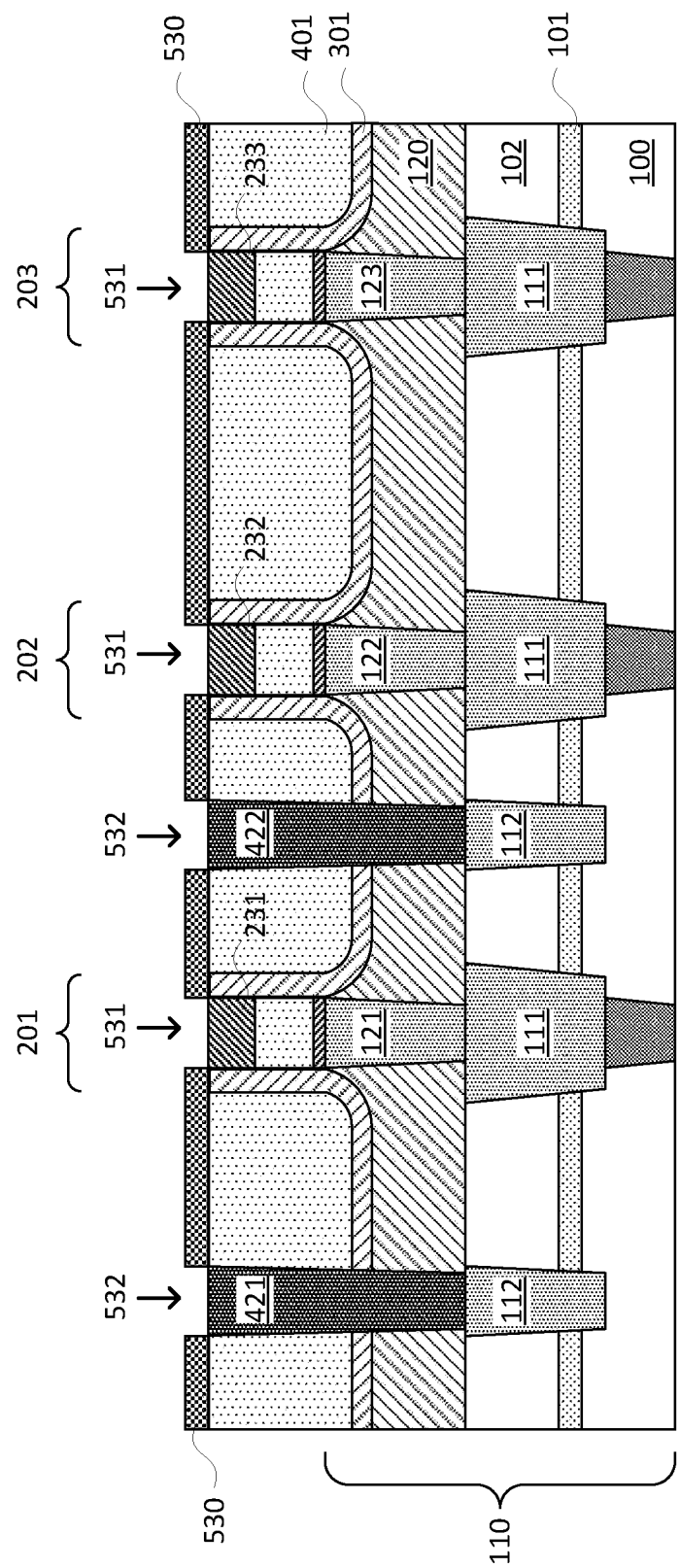
FIG. 10 is a demonstrative illustration of cross-sectional view of a MRAM device in a step of manufacturing thereof, following the step illustrated in FIG. 9, according to one embodiment of present invention.

FIG. 10 is a demonstrative illustration of cross-sectional view of a MRAM device in a step of manufacturing thereof, following the step illustrated in FIG. 9, according to one embodiment of present invention. More particularly, embodiments of present invention provide removing the SAM coating such as the cap layers 510 and 520, which are now surrounded by the metal oxide layer 530, from the top of the MTJ stacks 201, 202, and 203 and from the conductive vias 421 and 422. More particularly, the removing process may lift the cap layers 510, resulting in first openings 531 that expose the underneath top surfaces of the top electrodes 231, 232, and 232 of the MTJ stacks 201, 202, and 203. The removing process may also lift the cap layers 520, resulting in second openings 532 that expose the underneath top surfaces of the conductive vias 421 and 422.

Figure 11:
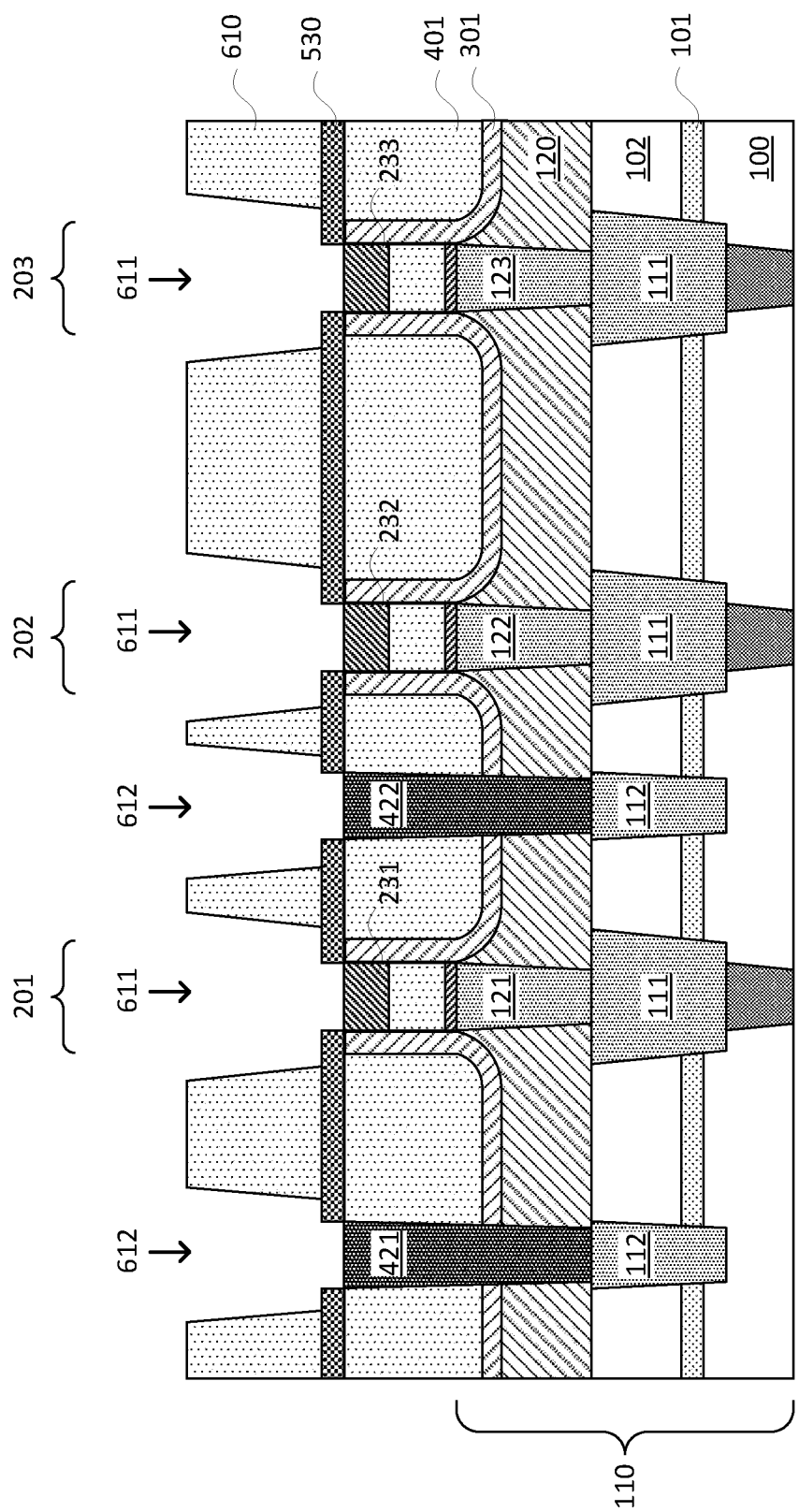
FIG. 11 is a demonstrative illustration of cross-sectional view of a MRAM device in a step of manufacturing thereof, following the step illustrated in FIG. 10, according to one embodiment of present invention.

FIG. 11 is a demonstrative illustration of cross-sectional view of a MRAM device in a step of manufacturing thereof, following the step illustrated in FIG. 10, according to one embodiment of present invention. More particularly, embodiments of present invention provide forming a second dielectric layer 610 on top of the metal oxide layer 530. Subsequently openings such as, for example, trench openings 611 and 612 may be created in the second dielectric layer 610. The second dielectric layer 610 may be a layer of ultra-low k dielectric material and may be formed through a CVD or PVD process. The second dielectric layer 610 and the metal oxide layer 530 may be made of different materials that have different etch selectivity. In other words, the second dielectric layer 610 and the metal oxide layer 530 may be made to have different etch selectivity. The etching process in creating trench openings 611 and 612 may stop at the metal oxide layer 530 and at the top surfaces of the top electrodes 231, 232, and 232 and at the top surfaces of the conductive vias 421 and 422. The trench openings 611 and 612 may be made to overlap with the first openings 531 and the second openings 532 in the metal oxide layer 530 to expose the top surfaces of the top electrodes 231, 232, and 233 and the top surfaces of the conductive vias 421 and 422.

Figure 12:
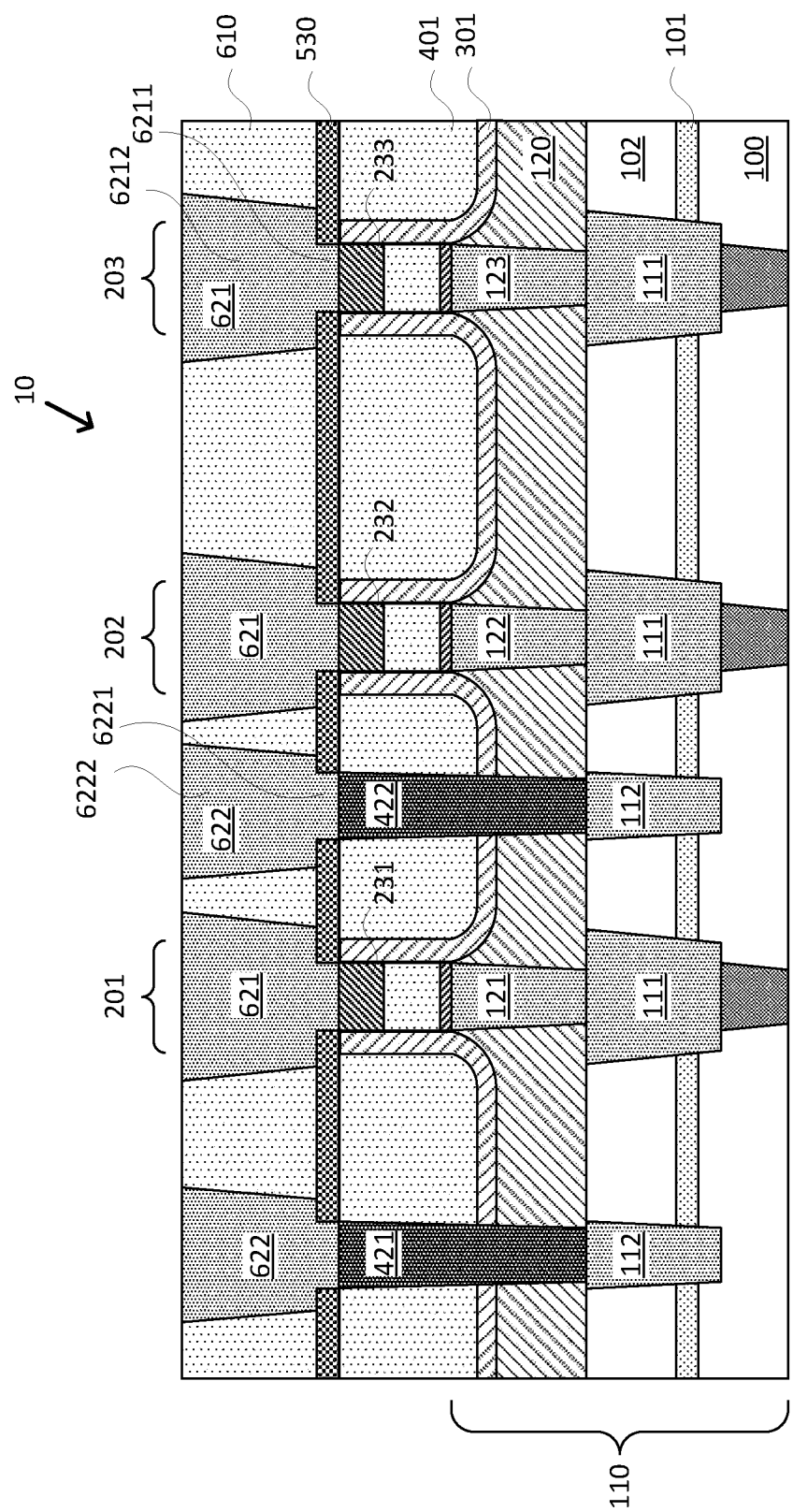
FIG. 12 is a demonstrative illustration of cross-sectional view of a MRAM device in a step of manufacturing thereof, following the step illustrated in FIG. 11, according to one embodiment of present invention.

FIG. 12 is a demonstrative illustration of cross-sectional view of a MRAM device in a step of manufacturing thereof, following the step illustrated in FIG. 11, according to one embodiment of present invention. More particularly, embodiments of present invention provide forming top contacts 621 in the openings 611 and via contacts 622 in the openings 612. In one embodiment, the top contacts 621 and the via contacts 622 may be a part of a metal layer, such as M3 or M4, of a back-end-of-line (BEOL) structure that are embedded in the second dielectric layer 610.

More particularly, forming the top contacts 621 and the via contacts 622 may include forming a liner (not shown) lining the trench openings 611 and 612 in the second dielectric layer 610 and depositing one or more conductive materials in the trench openings 611 and 612 above the liner. The conductive materials may include, for example, Cu, Co, Ru, W, Al and/or other suitable conductive materials that are generally used in forming metal levels in a BEOL environment. The conductive materials may be formed to be self-aligned with the top surfaces of the top electrodes 231, 232, and 232 and self-aligned with the top surfaces of the conductive vias 421 and 422.

In one embodiment, the top contacts 621 may include a first portion 6211 and a second portion 6212 on top of the first portion 6211. As a demonstrative example illustrated in FIG. 12, the first portion 6211 of the top contact 621 may be directly above the top surface of the top electrode 233 of the MTJ stack 203, and a second portion 6212 of the top contact 621 may be above the first portion 6211 and at least partially directly above the metal oxide layer 530. The first portion 6211 may be horizontally surrounded by the metal oxide layer 530 to have a substantially same size and a substantially same shape as that of the top electrode 233 of the MTJ stack 203. In other words, the first portion 6211 of the top contact 621 may be substantially, and vertically, aligned with the top surface of the top electrode 233 of the MTJ stack 203.

In the meantime, the via contacts 622 may include a first portion 6221 and a second portion 6222 on top of the first portion 6221. For example, the first portion 6221 of the via contacts 622 may be directly above the top surface of the conductive via 422. The first portion 6221 of the via contacts 622 may have a substantially same size and a substantially same shape as that of the conductive via 422 at the interface between the first portion 6221 of the via contact 622 and the conductive via 422. The second portion 6222 of the via contact 622 may be above the first portion 6221 and partially directly above the metal oxide layer 530. The first portion 6221 of the via contact 622 may be substantially, and vertically, aligned with the top surface of the conductive via 422.

Figure 13:
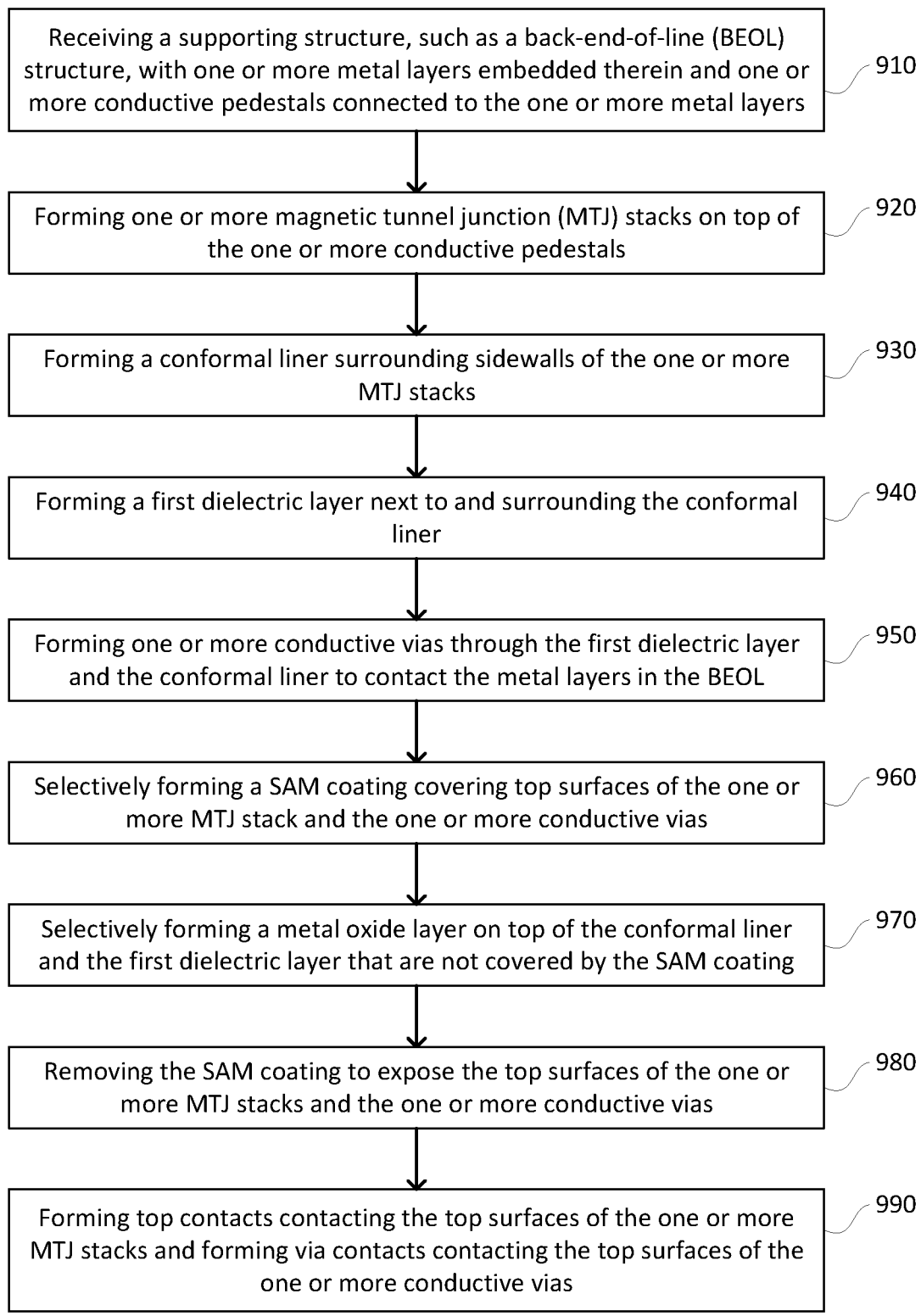
FIG. 13 is a demonstrative illustration of a flow-chart of a method of manufacturing a MRAM device according to embodiments of present invention.

FIG. 13 is a demonstrative illustration of a flow-chart of a method of manufacturing a MRAM device according to embodiments of present invention. The method includes (910) receiving a supporting structure, such as a BEOL structure, with one or more metal layers embedded therein that may form bottom contacts of the MRAM device and one or more conductive pedestals connected to the one or more metal layers; (920) forming one or more magnetic tunnel junction (MTJ) stacks on top of the one or more conductive pedestals in the supporting structure; (930) forming a conformal liner surrounding sidewalls of the one or more MTJ stacks; (940) forming a first dielectric layer next to and surrounding the conformal liner; (950) forming one or more conductive vias through the first dielectric layer and the conformal liner to contact the metal layers in the supporting structure; (960) selectively forming a SAM coating covering top surfaces of the one or more MTJ stacks and the one or more conductive via; (970) selectively forming a metal oxide layer on top of the conformal liner and the first dielectric layer that are not covered by the SAM coating; (980) removing the SAM coating to expose the top surfaces of the one or more MTJ stacks and the one or more conductive vias; and (990) forming top contacts contacting the top surfaces of the one or more MTJ stacks and forming via contacts contacting the top surfaces of the one or more conductive vias.

It is to be understood that the exemplary methods discussed herein may be readily incorporated with other semiconductor processing flows, semiconductor devices, and integrated circuits with various analog and digital circuitry or mixed-signal circuitry. In particular, integrated circuit dies can be fabricated with various devices such as field-effect transistors, bipolar transistors, metal-oxide-semiconductor transistors, diodes, capacitors, inductors, etc. An integrated circuit in accordance with the present invention can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein. Given the teachings of the invention provided herein, one of ordinary skill in the art will be able to contemplate other implementations and applications of the techniques of the invention.

Accordingly, at least portions of one or more of the semiconductor structures described herein may be implemented in integrated circuits. The resulting integrated circuit chips may be distributed by the fabricator in raw wafer form (that is, as a single wafer that has multiple unpackaged chips), as a bare die, or in a packaged form. In the latter case the chip may be mounted in a single chip package (such as a plastic carrier, with leads that are affixed to a motherboard or other high-level carrier) or in a multichip package (such as a ceramic carrier that has surface interconnections and/or buried interconnections). In any case the chip may then be integrated with other chips, discrete circuit elements, and/or other signal processing devices as part of either an intermediate product, such as a motherboard, or an end product. The end product may be any product that includes integrated circuit chips, ranging from toys and other low-end applications to advanced computer products having a display, a keyboard or other input device, and a central processor.

The descriptions of various embodiments of present invention have been presented for the purposes of illustration and they are not intended to be exhaustive and present invention are not limited to the embodiments disclosed. The terminology used herein was chosen to best explain the principles of the embodiments, practical application or technical improvement over technologies found in the marketplace, and to enable others of ordinary skill in the art to understand the embodiments disclosed herein. Many modifications, substitutions, changes, and equivalents will now occur to those of ordinary skill in the art. Such changes, modification, and/or alternative embodiments may be made without departing from the spirit of present invention and are hereby all contemplated and considered within the scope of present invention. It is, therefore, to be understood that the appended claims are intended to cover all such modifications and changes as fall within the spirit of the invention.

What is claimed is:

1. A MRAM device comprising:
   a MRAM structure, the MRAM structure comprising:
      a magnetic tunnel junction (MTJ) stack; and
      a top contact, the top contact having a first portion directly above the MTJ stack and a second portion above the first portion, wherein the first portion of the top contact is horizontally surrounded by a metal oxide layer, and a portion of the second portion is directly above the metal oxide layer; and
   a conductive via extending through a conformal liner and partially into a dielectric layer underneath the conformal liner, the conformal liner covering sidewalls of the MTJ stack.

2. The MRAM device of claim 1, further comprising:
   a via contact in contact with the conductive via, wherein the via contact has a first portion and a second portion, the first portion of the via contact is directly above the conductive via and has a substantially same size as that of the conductive via at an interface with the conductive via, and the second portion of the via contact is above the first portion of the via contact and is partially above the metal oxide layer.

3. The MRAM device of claim 1, wherein a top surface of the MTJ stack is substantially coplanar with a top surface of the conductive via.

4. The MRAM device of claim 1, wherein the first portion of the top contact is vertically aligned with a top surface of the MTJ stack.

5. The MRAM device of claim 1, wherein the conformal liner at the sidewalls of the MTJ stack is vertically covered by the metal oxide layer.

6. The MRAM device of claim 1, wherein the metal oxide layer comprises either aluminum-oxide (AlOx) or hafnium-oxide (HfOx).

7. The MRAM device of claim 1, wherein the MTJ stack includes a bottom electrode, the bottom electrode being on top of a conductive pedestal and the conductive pedestal being formed on top of a metal layer in a back-end-of-line (BEOL) structure.

8. A semiconductor structure comprising:
a MRAM structure, the MRAM structure comprising:
a magnetic tunnel junction (MTJ) stack;
a metal oxide layer being above a level of the MTJ stack;
a top contact being in direct contact with a top surface of the MTJ stack through a first opening in the metal oxide layer; and
a via contact in contact with a conductive via through a second opening in the metal oxide layer, wherein the via contact has a first portion and a second portion, the second portion being on top of the first portion and partially on top of the metal oxide layer and the first portion being surrounded horizontally by the metal oxide layer,
wherein the conductive via extends through a conformal liner into a dielectric layer, with the conformal liner covering the dielectric layer and sidewalls of the MTJ stack, and has a top surface that is substantially coplanar with the top surface of the MTJ stack.

9. The semiconductor structure of claim 8, wherein the first opening in the metal oxide layer is vertically aligned with the top surface of the MTJ stack.

10. The semiconductor structure of claim 8, wherein the first opening in the metal oxide layer has a substantially same size and a substantially same shape as that of the top surface of the MTJ stack.

11. The semiconductor structure of claim 8, wherein a first portion of the top contact is surrounded by the metal oxide layer and a second portion of the top contact is surrounded by a dielectric layer, and wherein the metal oxide layer and the dielectric layer are made of different materials to have different etch selectivity.

12. The semiconductor structure of claim 8, wherein the metal oxide layer comprises a material selected from a group consisting of aluminum-oxide (AlOx) and hafnium-oxide (HfOx).

13. A MRAM device comprising:
a first and a second MRAM structure, the first and the second MRAM structure each comprising:
a magnetic tunnel junction (MTJ) stack;
a top contact of a first portion and a second portion, the first portion being directly above the MTJ stack and horizontally surrounded by a metal oxide layer, and the second portion being directly and partially above the metal oxide layer; and
a bottom contact embedded in a dielectric layer;
a conductive via between the first and the second MRAM structure; and
a conformal liner covering continuously a sidewall of the first MRAM structure, a top surface of the dielectric layer between the first and the second MRAM structure, and a sidewall of the second MRAM structure, the conductive via vertically extending through the conformal liner into the dielectric layer.

14. The MRAM device of claim 13, further comprising:
a via contact in contact with the conductive via, wherein the via contact has a first portion and a second portion, the first portion of the via contact is directly above the conductive via and has a same size as that of the conductive via at an interface with the conductive via, and the second portion of the via contact is above the first portion of the via contact and partially above the metal oxide layer.

15. The MRAM device of claim 13, wherein a top surface of the MTJ stack of the first MRAM structure is coplanar with a top surface of the conductive via.

16. The MRAM device of claim 13, wherein the first portion of the top contact of the first MRAM structure is vertically aligned with a top surface of the MTJ stack of the first MRAM structure.

17. The MRAM device of claim 13, wherein the metal oxide layer comprises either aluminum-oxide (AlOx) or hafnium-oxide (HfOx).

18. The MRAM device of claim 13, wherein the MTJ stack of the first MRAM structure includes a bottom electrode, the bottom electrode being on top of a conductive pedestal and the conductive pedestal being formed on top of a metal layer in a back-end-of-line (BEOL) structure.

\* \* \* \* \*